United States Patent
Toh et al.

(10) Patent No.: US 8,647,937 B2
(45) Date of Patent: Feb. 11, 2014

(54) DEEP DEPLETED CHANNEL MOSFET WITH MINIMIZED DOPANT FLUCTUATION AND DIFFUSION LEVELS

(75) Inventors: Eng Huat Toh, Singapore (SG); Shyue Seng Tan, Singapore (SG)

(73) Assignee: Globalfoundries Singapore Pte. Ltd., Singapore (SG)

(*) Notice: Subject to any disclaimer, the term of this patent is extended or adjusted under 35 U.S.C. 154(b) by 0 days.

(21) Appl. No.: 13/533,090

(22) Filed: Jun. 26, 2012

(65) Prior Publication Data

US 2013/0341639 A1    Dec. 26, 2013

(51) Int. Cl.
*H01L 21/338* (2006.01)

(52) U.S. Cl.
USPC .......................................................... 438/183

(58) Field of Classification Search
USPC ............ 438/183, 184; 257/E21.453, E21.444
See application file for complete search history.

(56) References Cited

U.S. PATENT DOCUMENTS

2008/0237663 A1* 10/2008 Hanafi ........................ 257/289
2012/0261754 A1* 10/2012 Cheng et al. ................. 257/347

OTHER PUBLICATIONS

Fujita et al., "Advanced Channel Engineering Achieving Aggressive Reduction of VT Variation for Ultra-Low-Power Applications", conference publication, Dec. 2011, pp. 32.3.1-32.3.4, Electron Devices Meeting (IEDM).

\* cited by examiner

*Primary Examiner* — Selim Ahmed
(74) *Attorney, Agent, or Firm* — Ditthavong Mori & Steiner, P.C.

(57) ABSTRACT

CMOS devices are fabricated with a channel layer having minimized dopant fluctuation and diffusion. Embodiments include forming a dummy gate, on a substrate, between a pair of spacers, forming, in the substrate, a source and drain separated by a ground plane layer, removing the dummy gate from the substrate, forming a cavity between the pair of spacers, forming, after removal of the dummy gate, a channel layer on the substrate, forming a high-k layer on the channel layer and on side surfaces of the cavity, and forming a replacement gate in the cavity.

12 Claims, 12 Drawing Sheets

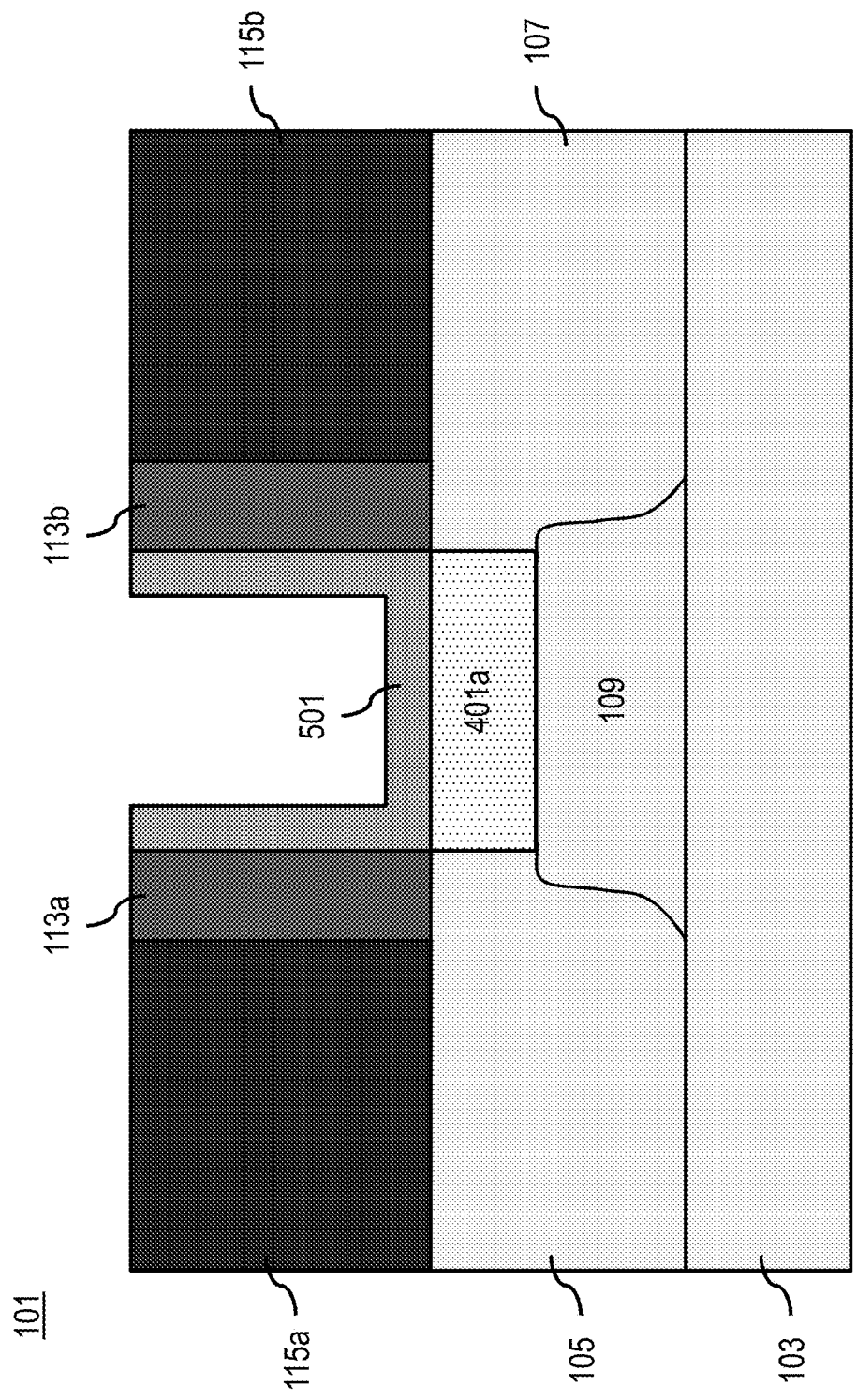

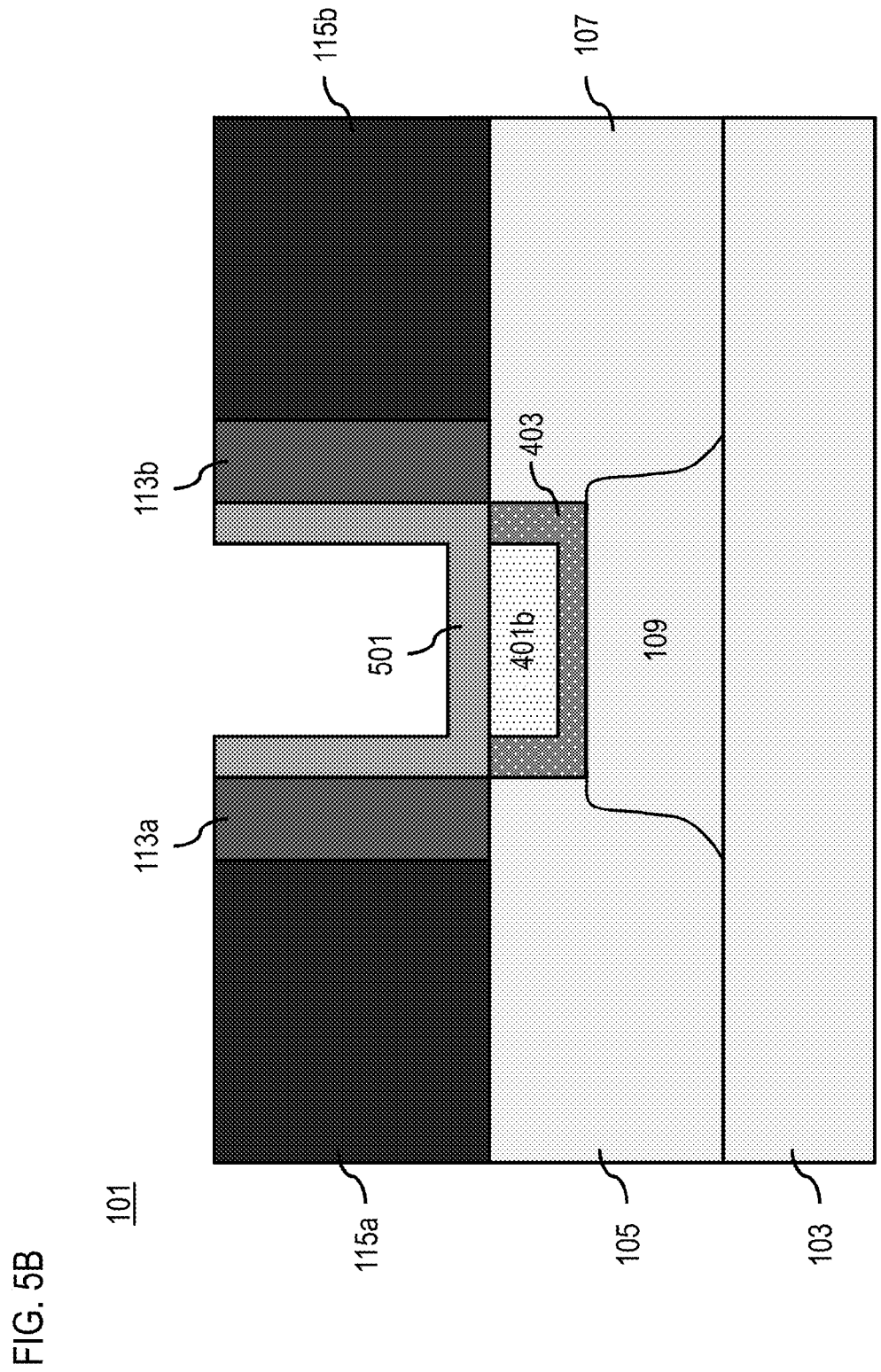

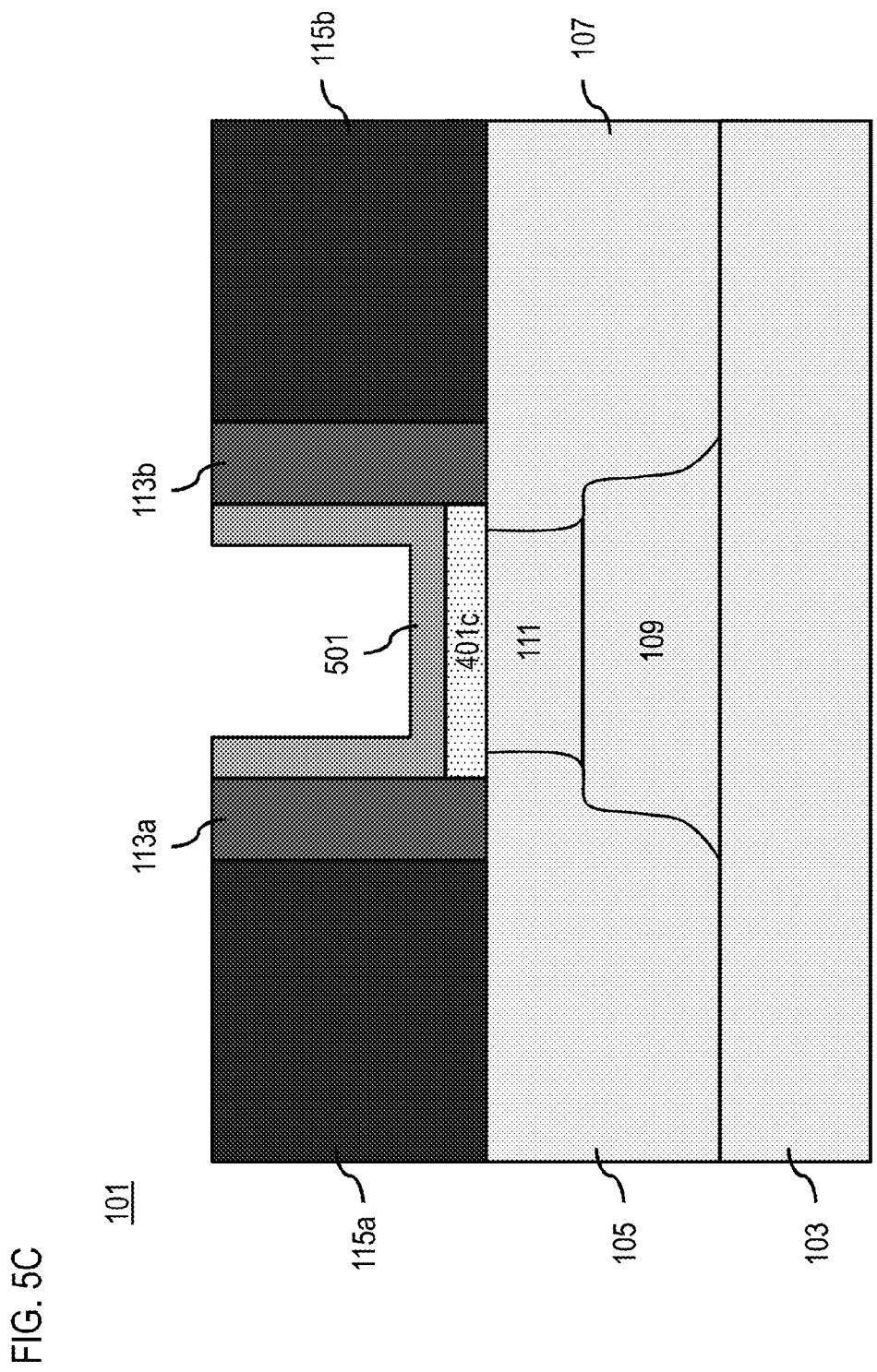

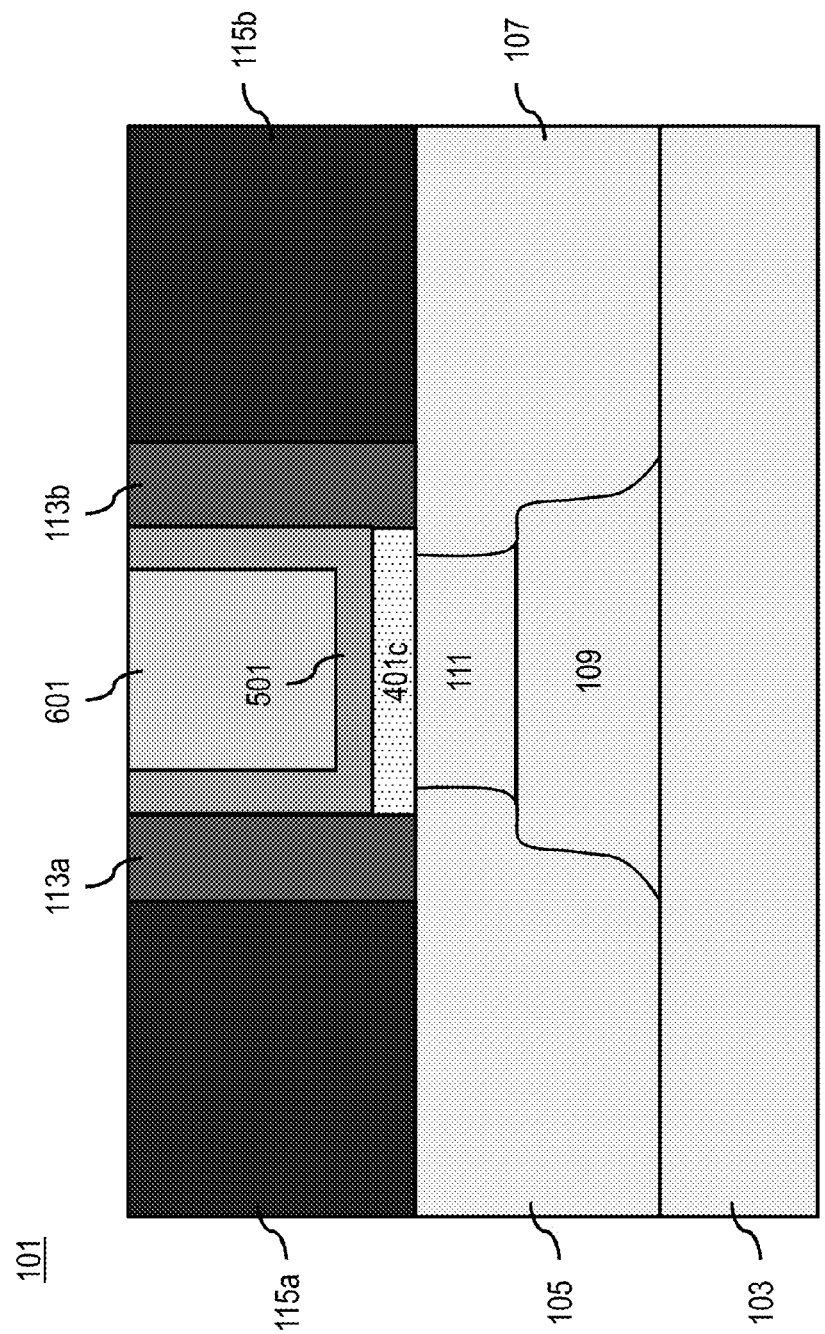

DEEP DEPLETED CHANNEL MOSFET WITH MINIMIZED DOPANT FLUCTUATION AND DIFFUSION LEVELS

TECHNICAL FIELD

The present disclosure relates to the fabrication of semiconductor devices for bulk complementary metal-oxide-semiconductor (CMOS) technology. The present disclosure is particularly applicable to deeply depleted channel metal-oxide-semiconductor field-effect transistor (DDC MOSFET) utilizing advanced technology, for example for semiconductor technology nodes of 20 nanometers (nm) and beyond.

BACKGROUND

In bulk CMOS technologies, the mainstream technology of bulk MOSFET has poor scalability beyond semiconductor manufacturing processes of 32 nm and below. To circumvent the poor scalability of the bulk MOSFET, numerous alternatives have been proposed (e.g., fully-depleted (FD) or extremely thin (ET) silicon-on-insulator (SOI) MOSFET, 3D fin field effect transistor (FinFET)). However, each of the alternatives has significant drawbacks. For instance, the FD/ET SOI MOSFET requires expensive wafers with well-controlled thin silicon (tSi) films down to 5 nm resulting in a high series resistance (Rseries). Additionally, the 3D FinFET has a complex integration process, fin variation issues, and also has a high Rseries.

The DDC MOSFET has an improved performance over the bulk MOSFET (e.g., increased mobility, lower threshold voltage (Vt), reduced random dopant fluctuation (RDF), low power, etc.). However, traditional DDC MOSFET technologies require a thermal budget after forming the channel layer in order to achieve adequate dopant fluctuation and diffusion levels. As such, conventional steps (e.g., gate oxide formation, epitaxial source/drain (S/D) pre-bake, S/D rapid thermal anneal (RTA)) limit depleted layer scaling which is necessary for semiconductor manufacturing processes below 10 nm. Additionally, in order to maintain the thermal budget, traditional DDC MOSFET technologies frequently require special low temperature gate oxide growth and low RTA temperatures that adversely impact oxide quality and process capability.

A need therefore exists for methodology enabling formation of an improved DDC MOSFET having minimized dopant fluctuation and diffusion levels, and the resulting device.

SUMMARY

An aspect of the present disclosure is forming a channel layer after removal of a dummy gate and exposing a channel layer only to temperatures below 600 degrees Celsius (° C.) to minimize dopant fluctuation and diffusion levels, reduce RDF, and have a low mobility degradation. Additionally, the forming of the channel layer after removal of the dummy gate enables the depleted layer to be made of different materials than the substrate of the source and drain, resulting in beneficial strain, higher mobility, and reduced S/D junction leakages.

Another aspect of the present disclosure is an improved DDC MOSFET having minimized dopant fluctuation and diffusion levels, a reduced RDF, and low mobility degradation by forming a channel layer after all high thermal (e.g., temperatures exceeding 700° C.) steps are performed.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a dummy gate, on a substrate, between a pair of spacers; forming, in the substrate, a source and drain separated by a ground plane layer; removing the dummy gate from the substrate, forming a cavity between the pair of spacers; forming, after removal of the dummy gate, a channel layer on the substrate; forming a high-k layer on the channel layer and on side surfaces of the cavity; and forming a replacement gate in the cavity.

Aspects of the present disclosure include: forming a recess in the substrate above at least part of the ground plane layer, after removing the dummy gate; and forming the channel layer in the recess. Some aspects include forming the recess by a reactive-ion etch (RIE) or a selective wet etch. Another aspect includes forming a halo layer in the recess prior to forming the channel layer, the halo layer separating the channel layer from the ground plane layer, the source, and the drain. Additional aspects include epitaxially forming the halo layer of silicon (Si), silicon germanium (SiGe), or germanium (Ge) to a thickness of between 5 nm and 20 nm. Further aspects include forming the channel layer of multiple layers including a layer of intrinsic Si on a layer of intrinsic SiGe or instrinsic silicon carbon (Si:C). Some aspects include epitaxially forming the channel layer of intrinsic Si, intrinsic SiGe, or intrinsic Ge; and forming, in the substrate, a depleted layer of SiGe, Si:C, silicon germanium tin (SiGeSn), germanium tin (GeSn), gallium arsenide (GaAs), indium arsenide (InAs), or indium phosphorus (InP). Additional aspects include forming the channel layer of an element or compound composed of one or more elements from groups III, IV, and V; and forming, in the substrate, a depleted layer of a different material than the source, the drain, the substrate, or a combination thereof. Additional aspects include: providing the ground plane layer to a thickness of between 10 nm and 100 nm; forming the channel layer to a thickness of between 3 nm and 30 nm; and forming, in the substrate, a depleted layer to a thickness of between 3 nm and 30 nm.

Another aspect of the present disclosure is a device including: a substrate; a source and a drain in the substrate, separated by a ground plane layer; a channel layer over the ground plane layer, the channel layer being formed after all high thermal steps are performed to the device; a gate electrode over the channel layer; and a high-k layer on side surfaces of the gate electrode and between the channel layer and the gate electrode.

Aspects include a device wherein the channel layer is formed in a recess in a substrate above at least part of the ground plane layer. Some aspects include a halo layer separating the channel layer from the ground plane layer, the source, and the drain. Additional aspects include a device wherein the halo layer is epitaxially formed of Si, SiGe, or Ge and has a thickness of between 5 nm and 20 nm. Further aspects include a device wherein the channel layer is formed of multiple layers including a layer of intrinsic Si on a layer of intrinsic SiGe or intrinsic Si:C. Some aspects include a device wherein the channel layer is epitaxially formed of intrinsic Si, intrinsic SiGe, or intrinsic Ge. Additional aspects include, in the substrate, a depleted layer of SiGe, Si:C, SiGeSn, GeSn, GaAs, InAs, or InP, wherein the channel layer is formed of an element or compound composed of one or more elements from groups III, IV, and V, and wherein all steps subsequent to the forming of the channel layer have temperatures below 600° C. Further aspects include, in the substrate, a depleted layer of a different material than the source, the drain, the substrate, or a combination thereof, wherein the ground plane layer has a thickness of between 10 nm and 100 nm, the channel layer has a thickness of between 3 nm and 30 nm, and high thermal steps have temperatures exceeding 700° C.

A further aspect of the present disclosure includes: forming a dummy gate, on a substrate, between a pair of spacers; forming, in the substrate, a source and drain separated by a ground plane layer having a thickness of between 10 nm and 100 nm; forming, on the substrate, a depleted layer of SiGe, Si:C, SiGeSn, GeSn, GaAs, InAs, or InP to a thickness of between 3 nm and 30 nm, the depleted layer being formed of a different material than the source, the drain, the substrate, or a combination thereof; removing the dummy gate from the substrate, forming a cavity between the pair of spacers; epitaxially growing, after removal of the dummy gate, a channel layer on the ground plane layer, of intrinsic Si, intrinsic SiGe, or intrinsic Ge to a thickness of between 3 nm and 30 nm; forming a high-k layer on the channel layer and on side surfaces of the cavity; and forming a replacement gate in the cavity.

Aspects include etching a recess in a substrate above at least part of the ground plane layer by a RIE or a selective wet etch, after removal of the dummy gate; and epitaxially growing the channel layer in the recess. Some aspects include epitaxially growing a halo layer of Si, SiGe, or Ge to a thickness of between 5 nm and 20 nm in the recess prior to epitaxially growing the channel layer, the halo layer separating the channel layer from the ground plane layer, the source, and the drain.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1 through 6 schematically illustrate sequential steps of a method in accordance with exemplary embodiments, with FIGS. 4A, 5A, and 6A illustrating steps of a first embodiment, FIGS. 4B, 5B, and 6B illustrating steps of a second embodiment, and FIGS. 4C, 5C, and 6C illustrating steps of a third embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of high dopant fluctuation and diffusion attendant upon traditional DDC MOSFET technologies. In accordance with embodiments of the present disclosure, a dummy gate is formed to allow a channel layer to be formed after high thermal steps are performed on the substrate. Specifically, forming the channel layer after removal of a dummy gate, and/or after all high thermal steps are performed enables a channel having minimized dopant fluctuation and diffusion levels, resulting in an improved depleted layer scalability (e.g., semiconductor manufacturing processes below 20 nm), and a minimized Vt variation.

Methodology in accordance with embodiments of the present disclosure includes forming a dummy gate, on a substrate, between a pair of spacers, forming, in the substrate, a source and drain separated by a ground plane layer, removing the dummy gate from the substrate, forming a cavity between the pair of spacers, forming, after removal of the dummy gate, a channel layer on the substrate, forming a high-k layer on the channel layer and on side surfaces of the cavity, and forming a replacement gate in the cavity.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
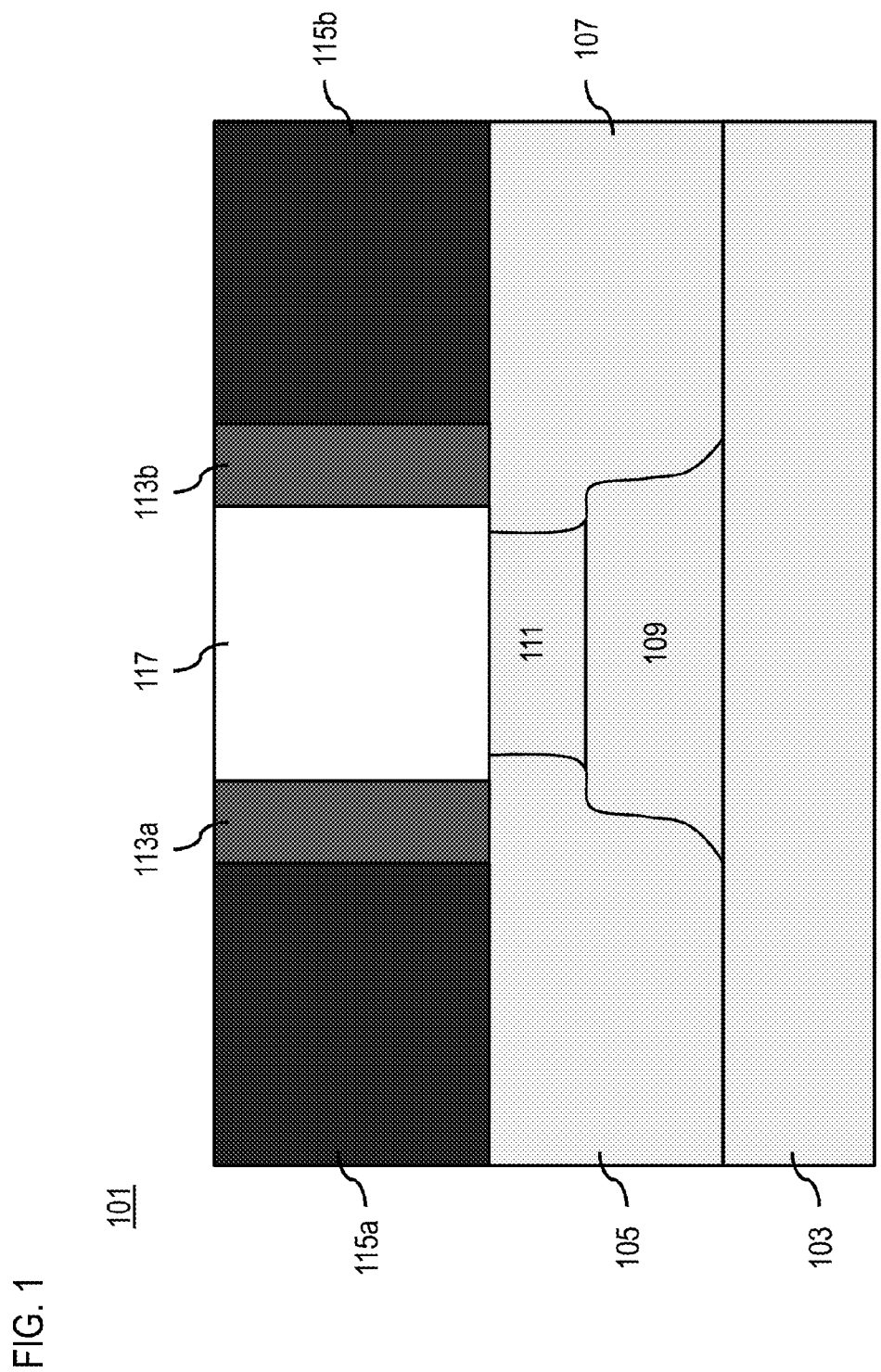

Adverting to FIG. 1, the process in accordance with exemplary embodiments begins with a substrate 101 formed by conventional front end of line (FEOL) processes. Substrate 101 includes bulk layer 103, a source 105 and a drain 107 separated by a ground plane layer 109 and a depleted layer 111, spacers 113a and 113b, interlayer dielectric (ILD) 115a and 115b, and dummy gate 117. The ground plane layer 109 has a thickness of between 10 nm and 100 nm. The depleted layer 111 may be formed of the same or a different material than the source 105 and the drain 107 or the substrate 101. For example, the depleted layer 111 may be formed of SiGe, Si:C, SiGeSn, GeSn, GaAs, InAs, and InP for a strained high mobility channel, since the thermal budget after formation of the depleted layer is low and will not cause strain relaxation or thermal mixing between the depleted layer and the substrate. Further, a lattice mismatch between the depleted layer 111 and the substrate 101 may cause beneficial strain. Also, the depleted layer 111 may be formed of materials that are difficult to use in achieving good S/D dopant activation, such as GaAs, while the source 105, the drain 107, and substrate 101 may be formed of materials more suitable for achieving good S/D dopant activation, such as Si. In addition, a material of the depleted layer 111 may be selected that reduces S/D junction leakages. For example, S/D junction leakages may be reduced by forming the depleted layer 111 of SiGe, and the source 105 and the drain 107 of Si.

Figure 2:
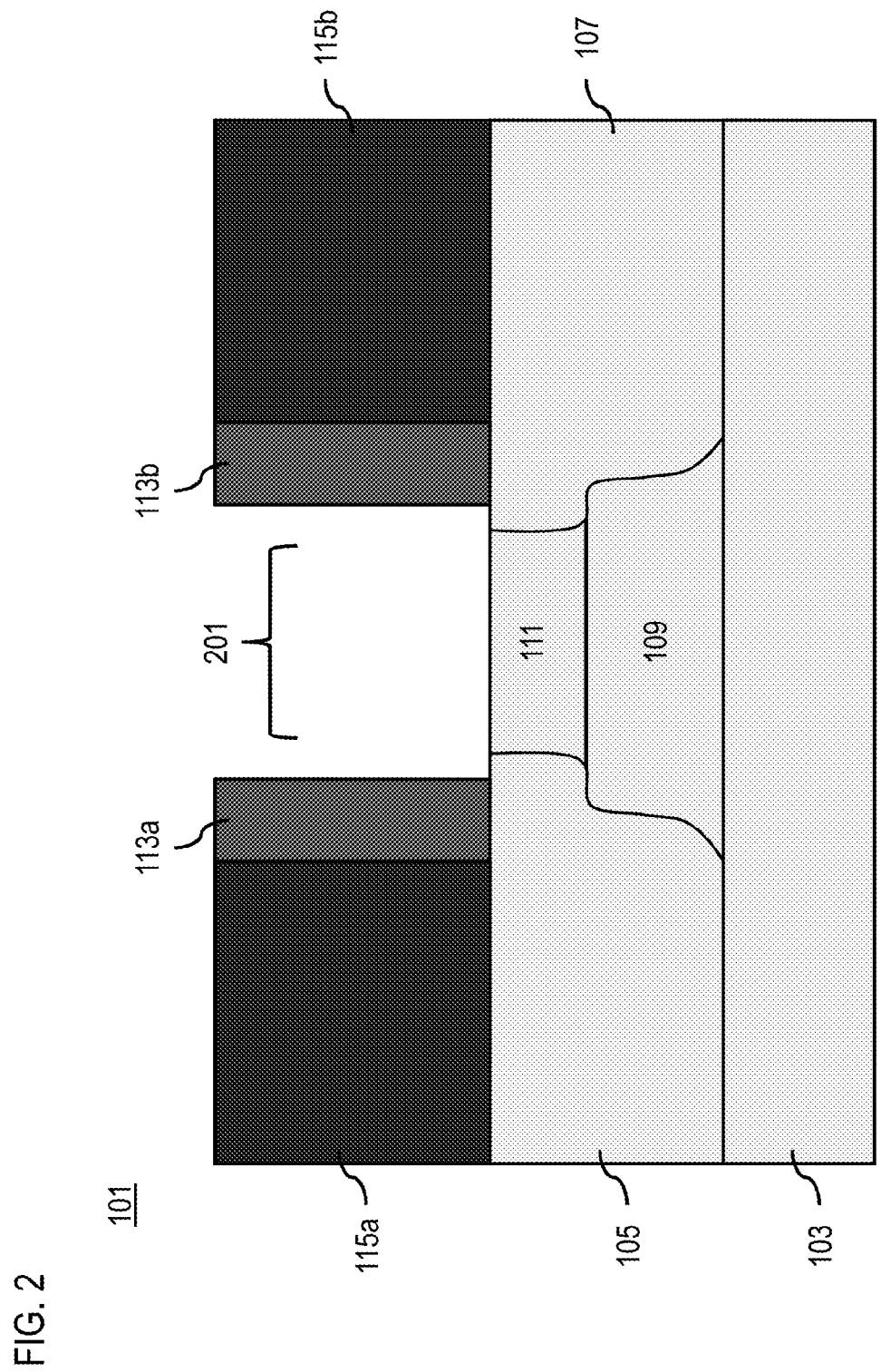
Figure 3:
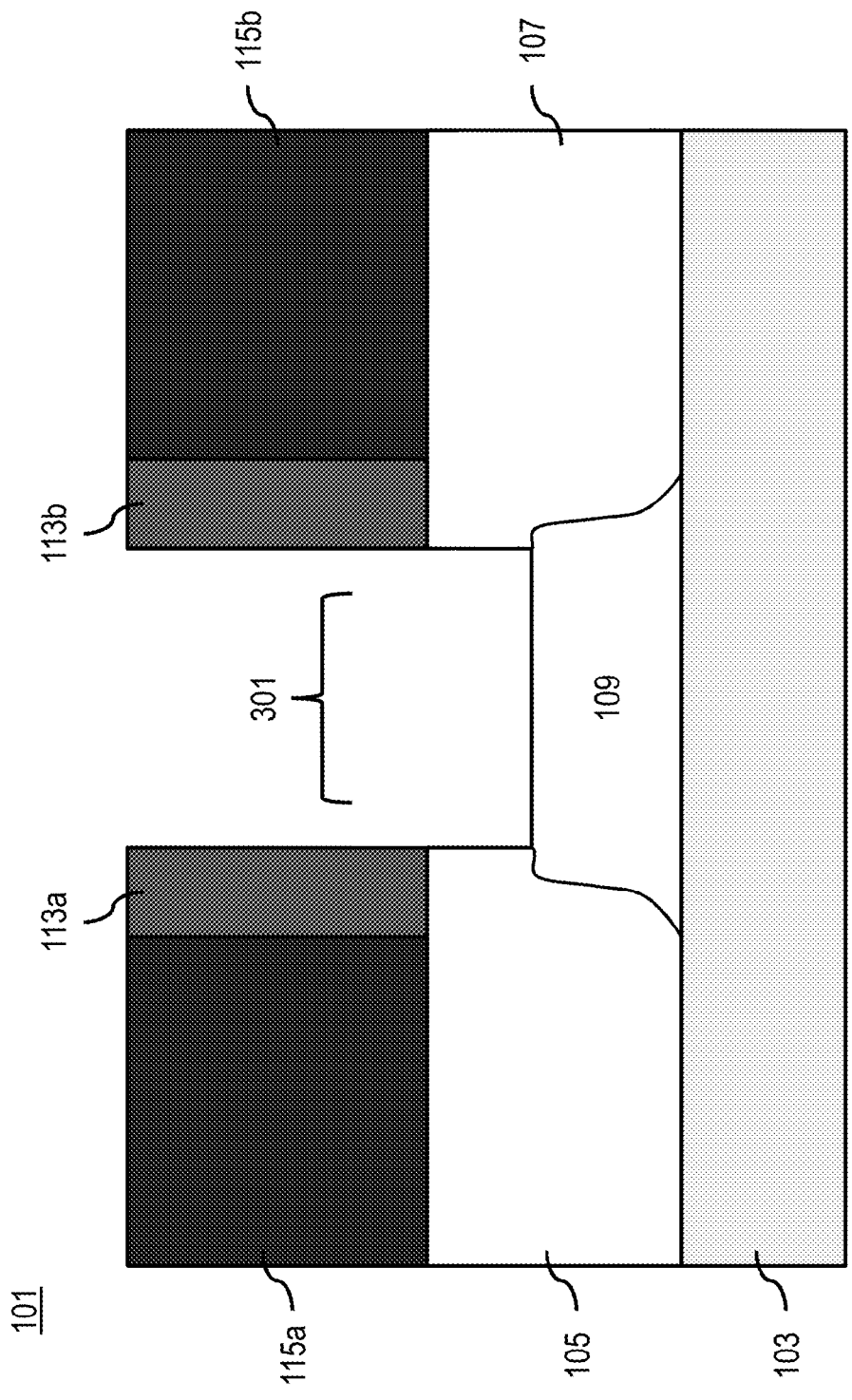

Adverting to FIG. 2 a cavity 201 is formed by removing the dummy gate 117, for example, per a replacement metal gate (RMG) process. As illustrated in FIG. 3, a recess 301 is etched into the depleted layer 111. Additionally, the recess 301 may be etched into the ground plane 109. The recess 301 may be formed by a RIE or a selective wet etch, for example to a depth of 3 nm to 70 nm.

Figure 4A:
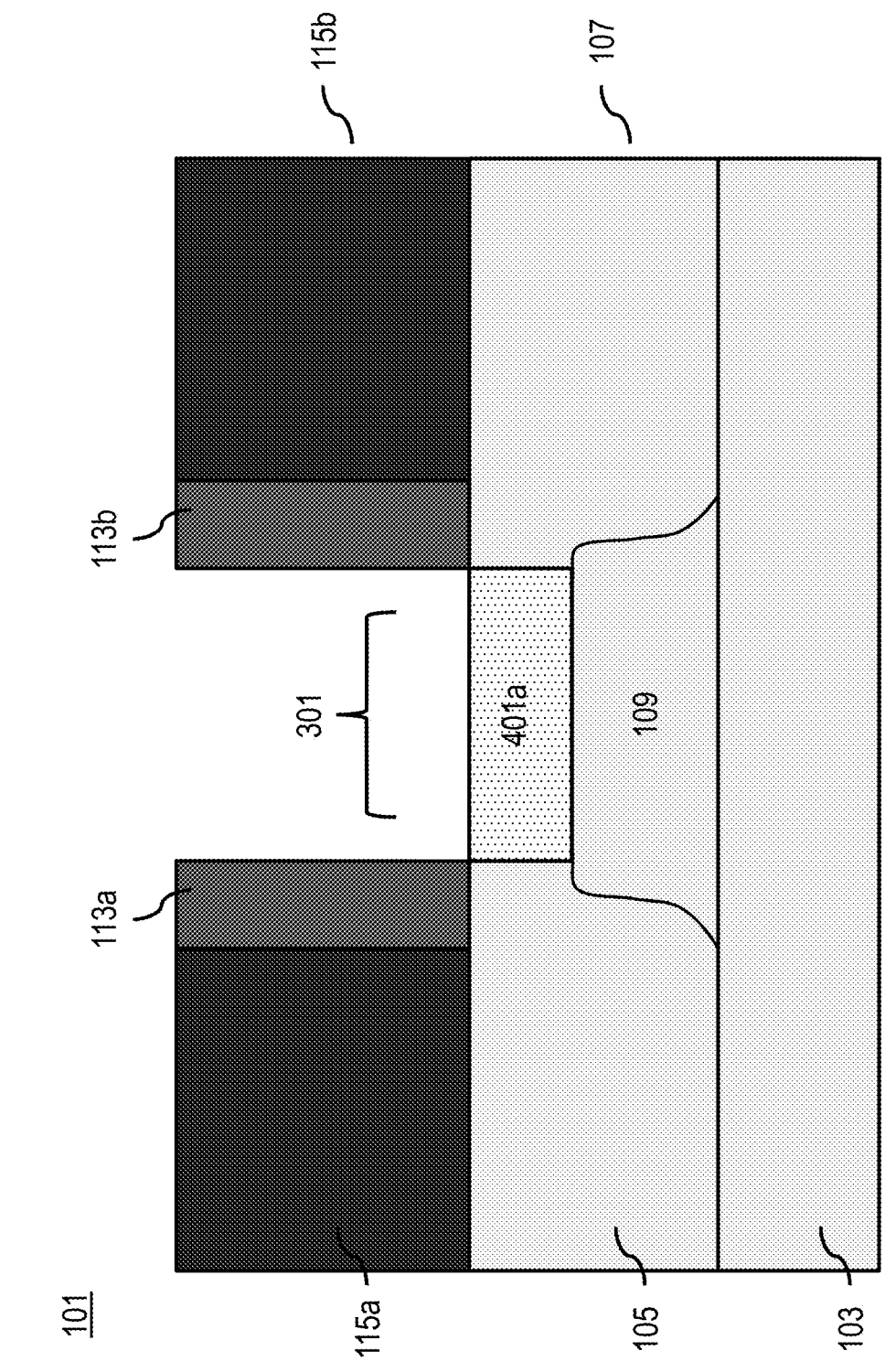

Adverting to FIG. 4A, in accordance with a first exemplary embodiment, a channel layer 401a is formed in the recess 301 after removal of the dummy gate 117. The channel layer 401a may be epitaxially formed of intrinsic Si, intrinsic SiGe, or intrinsic Ge. Additionally, or alternatively, the channel layer 401a may be formed of an element or compound from the groups III, IV, and V. Further, the channel layer 401a may be formed of multiple layers including a layer of intrinsic Si on layer of intrinsic SiGe or intrinsic Si:C, for strain, mobility, Vt setting, and/or a diffusion barrier. The channel layer 401a is formed to a thickness of between 3 nm and 30 nm and may be doped in situ.

Figure 4B:
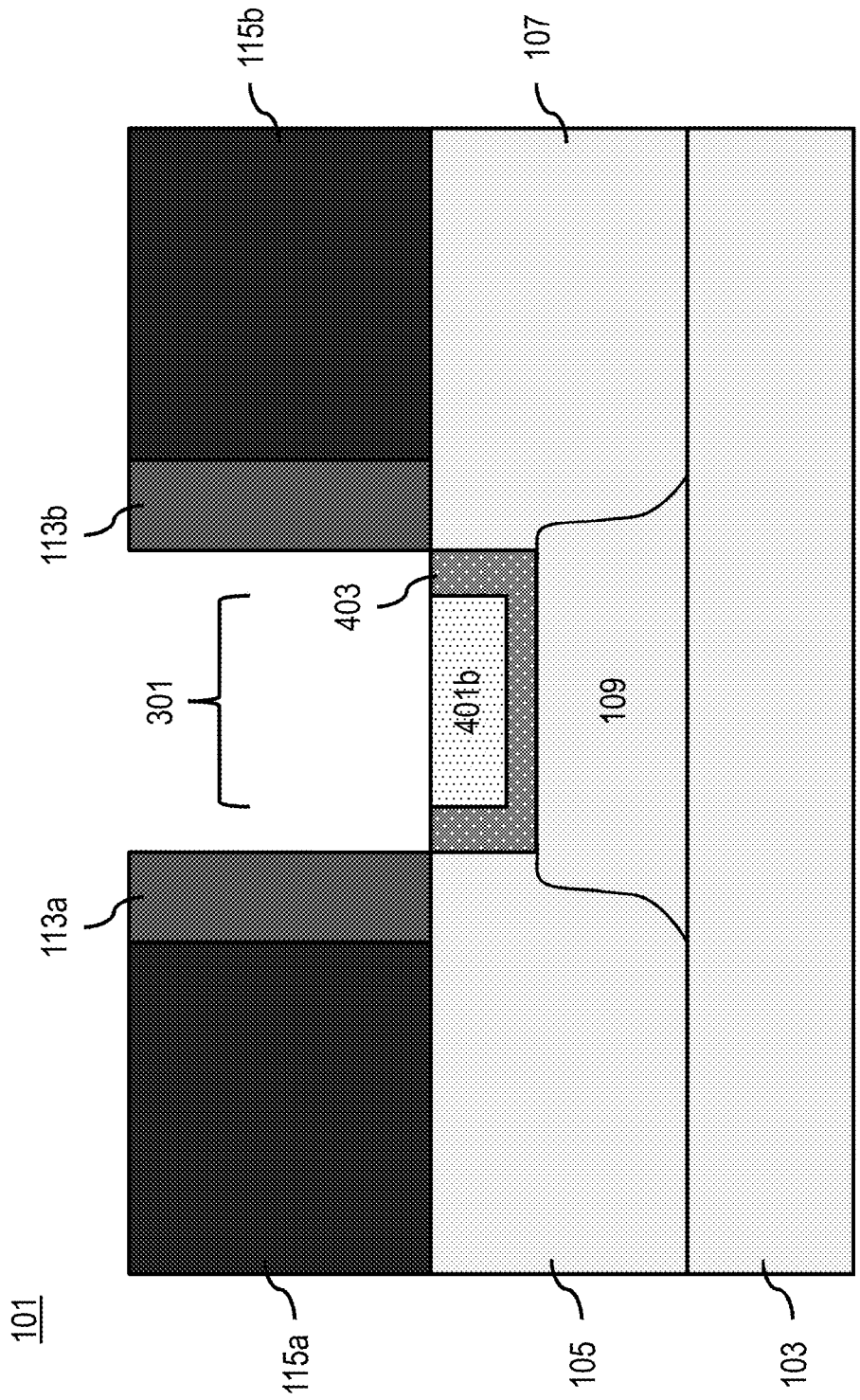

In accordance with a second embodiment, shown in FIG. 4B, a channel 401b is formed in recess 301. Channel 401b may be formed of the same materials as and in a manner similar to channel 401a. However, in the second embodiment, a halo layer 403 separating the channel layer 401b from the ground plane 109, the source 105 and the drain 107 is formed in recess 301 prior to forming the channel 401b. The halo layer 403 may be epitaxially formed of Si, SiGe, or Ge to a thickness of between 5 nm and 20 nm. Including halo layer 403 minimizes leakages, improves the short channel effect (SCE), and reduces RDF.

Figure 4C:
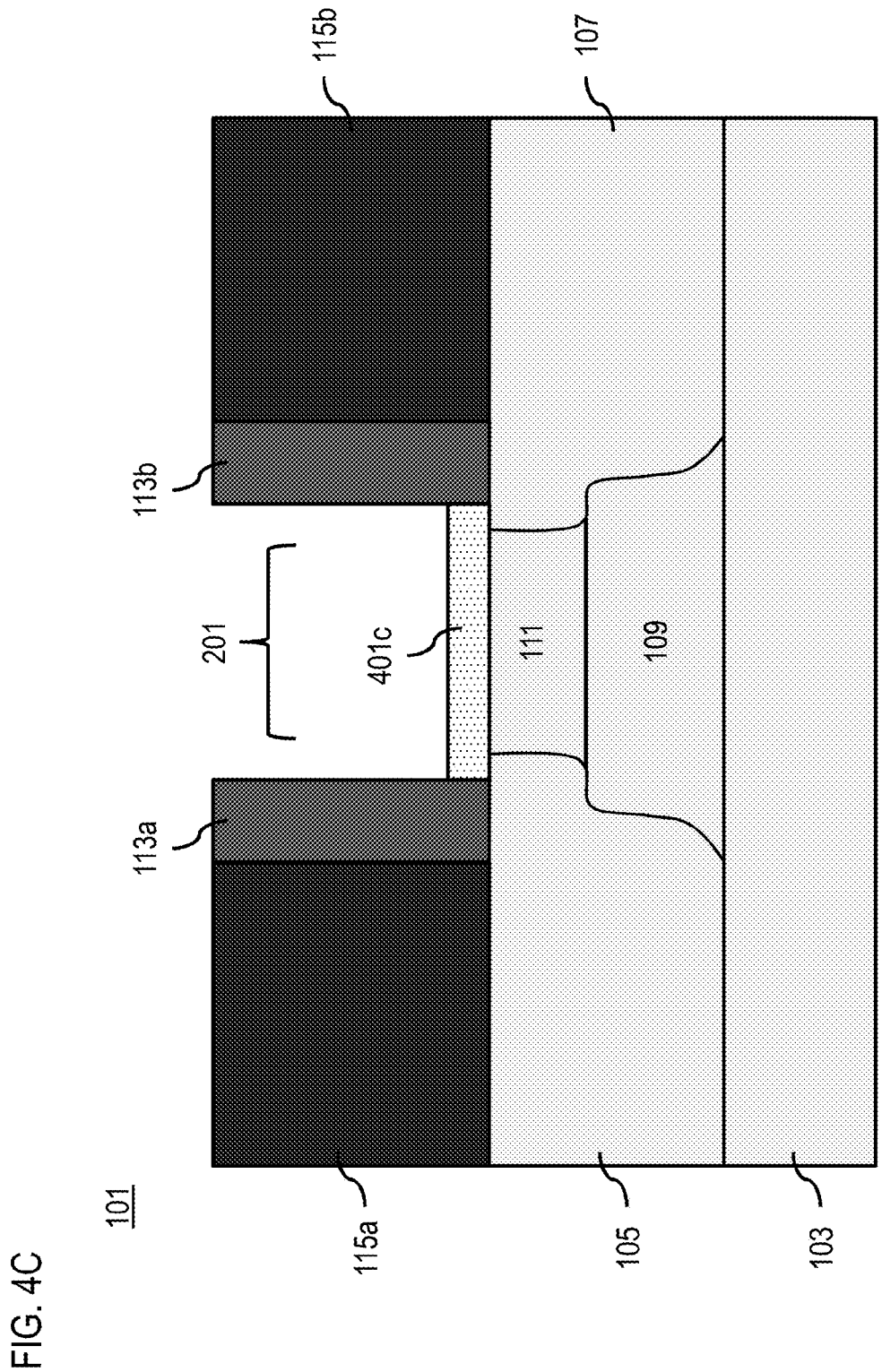

Alternatively, the etching of recess 301 shown in FIG. 3 may be omitted and a channel 401c may be formed in the cavity 201, for instance, on the depleted layer 111 as shown in FIG. 4C, in accordance with a third embodiment. Channel 401c may be formed of the same materials as and by a similar process to channel 401a. Channel 401c may, however, be formed to a thickness of 3 nm to 30 nm.

The channel layer 401a, 401b, or 401c may be grown after shallow trench isolation (STI) implantation, lightly doped drain (LDD) implantation, high thermal oxide and S/D anneal, and well anneal. In this manner, the channel layer 401a, 401b, or 401c is formed after all high thermal steps. As used herein, high thermal steps expose the channel layer 401a, 401b, 401c and/or the depleted layer 111 to temperatures exceeding 700° C., for example exceeding 800° C. Additionally, forming the channel layer 401a, 401b, or 401c after removing the dummy gate 117 enables all steps performed after formation of the channel layer 401a, 401b, or 401c to have temperatures below 600° C., for example below 400° C. Thus, there is minimal diffusion from the ground plane layer 109 and a LDD layer (e.g., channel layer 401a, 401b, 401c), resulting in an improved DDC MOSFET having minimized dopant fluctuation and diffusion levels, a reduced RDF, and low mobility degradation. Additionally, the improved DDC MOSFET has an improved gate oxide quality that is not adversely by a high thermal budget.

It should be noted that S/D silicide may be formed before or after the RMG process, as normal silicide process temperatures are below 600° C. However, some silicide processes may include a laser annealing step between 600° C. and 900° C. Even if such a laser anneal occurs after formation of the channel layer, the laser anneal causes minimal to no diffusion.

Figure 6A:
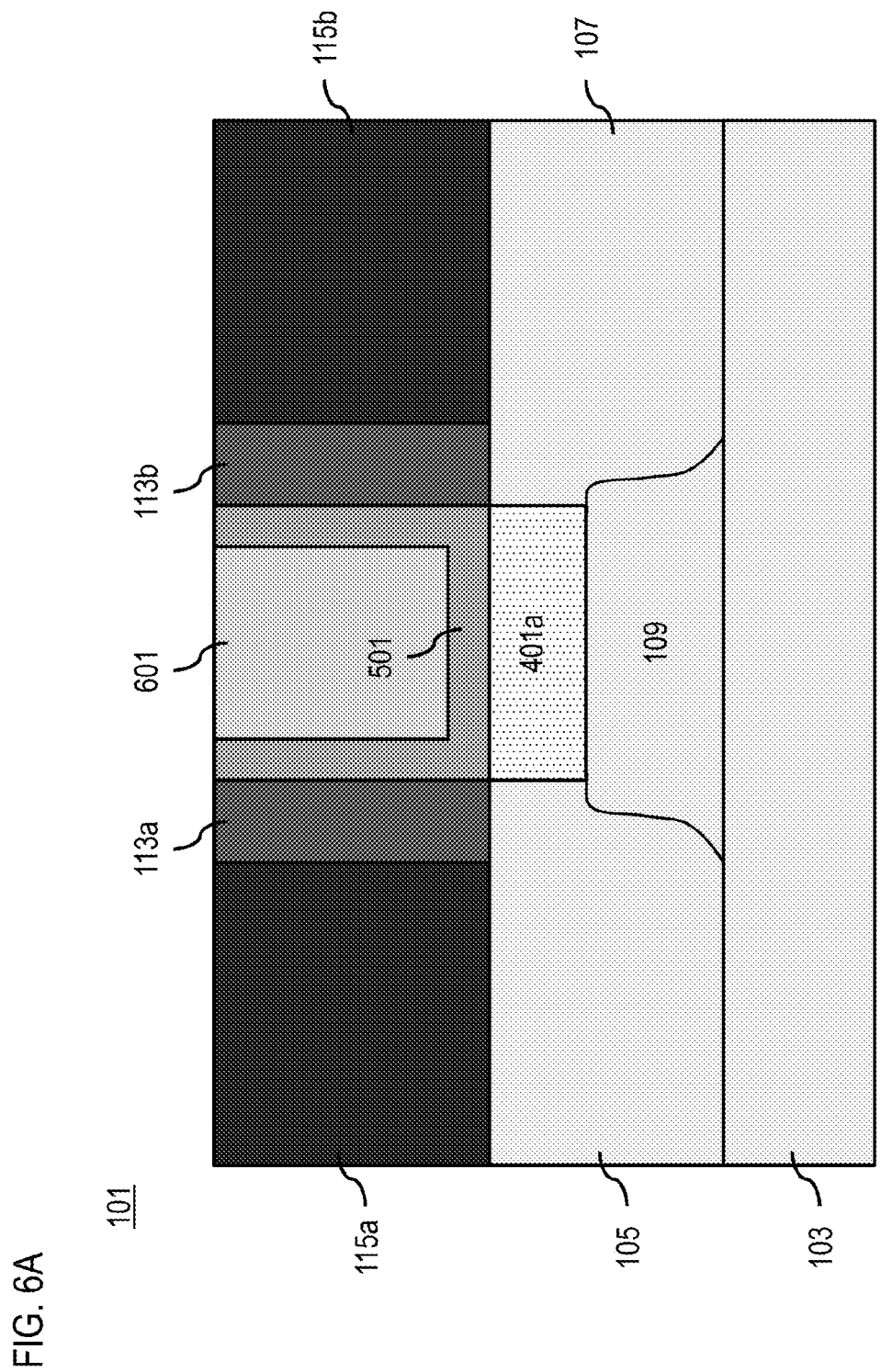
Figure 6B:
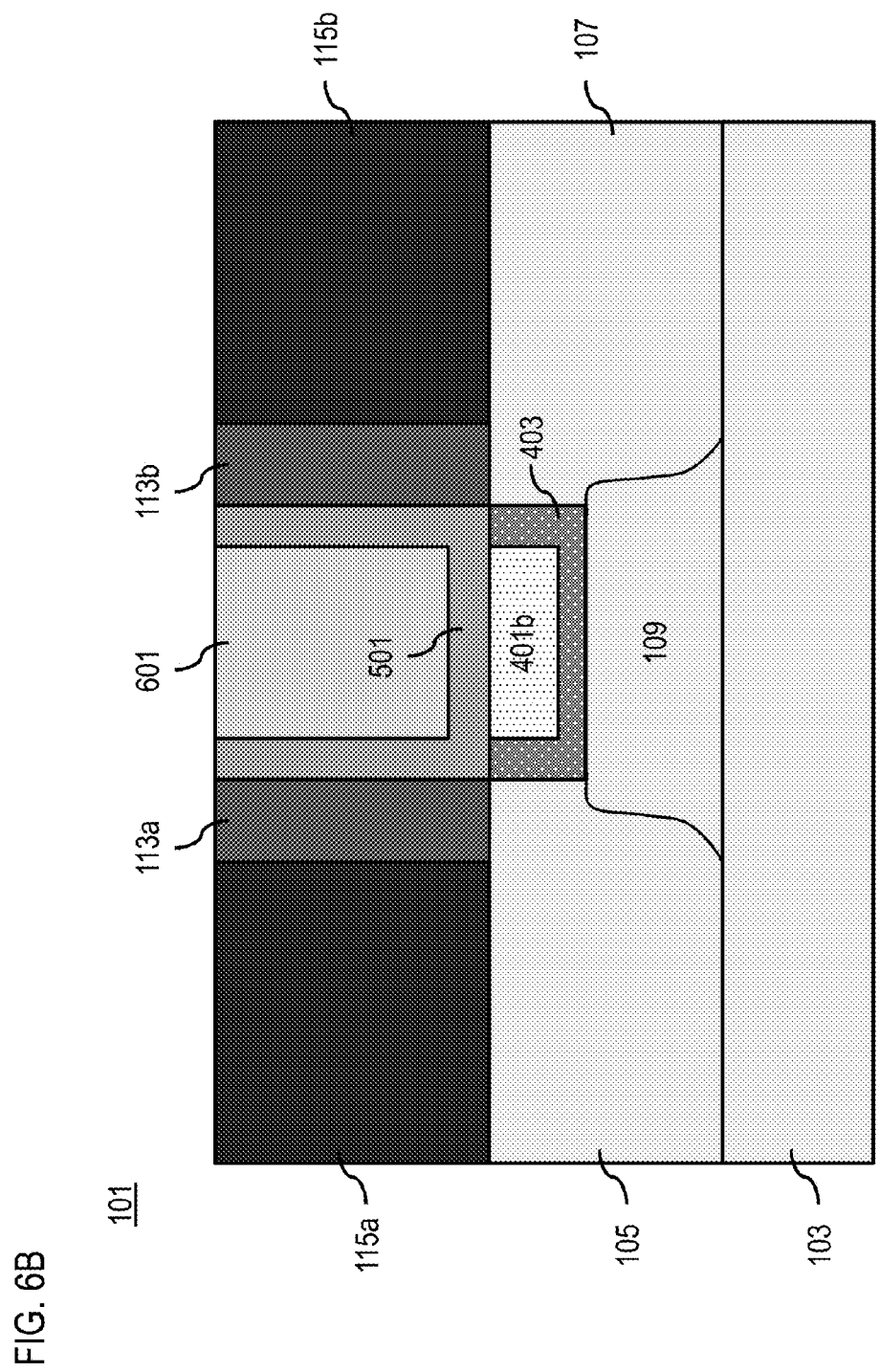

As illustrated in FIGS. 5A, 5B, and 5C, a high-k layer 501 is formed on the channel layer 401a, 401b, and 401c, respectively, and on side surfaces of cavity 201, for instance, on the spacers 113a and 113b. Adverting to FIGS. 6A, 6B, and 6C, a replacement gate 601 is formed in the cavity 201, for instance, on the high-k layer 501. Subsequently, conventional back end of line (BEOL) steps may be applied to the substrate 101. In addition, the steps illustrated in FIGS. 1 through 6 may be performed with respect to other semiconductor devices for CMOS technology, such as bulk FinFET devices.

The embodiments of the present disclosure can achieve several technical effects, including CMOS with a high mobility, low Vt, low S/D junction leakages, a beneficial strain between depleted layer and the substrate, and minimized dopant fluctuation and diffusion levels. The present disclosure enjoys industrial applicability in any of various types of highly integrated semiconductor devices, particularly for 20 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a dummy gate, on a substrate, between a pair of spacers;
   forming, in the substrate, a source and drain separated by a ground plane layer;
   removing the dummy gate from the substrate, forming a cavity between the pair of spacers;
   forming, after removal of the dummy gate, a channel layer on the substrate;
   forming a high-k layer on the channel layer and on side surfaces of the cavity; and
   forming a replacement gate in the cavity.

2. The method according to claim 1, comprising:
   forming a recess in the substrate above at least part of the ground plane layer, after removing the dummy gate; and
   forming the channel layer in the recess.

3. The method according to claim 2, further comprising forming the recess by a reactive-ion etch (RIE) or a selective wet etch.

4. The method according to claim 2, comprising:
   forming a halo layer in the recess prior to forming the channel layer, the halo layer separating the channel layer from the ground plane layer, the source, and the drain.

5. The method according to claim 4, comprising epitaxially forming the halo layer of silicon (Si), silicon germanium (SiGe), or germanium (Ge) to a thickness of between 5 nanometers (nm) and 20 nm.

6. The method according to claim 1, comprising forming the channel layer of multiple layers including a layer of intrinsic Si on a layer of intrinsic SiGe or instrinsic silicon carbon (Si:C).

7. The method according to claim 1, comprising:
   epitaxially forming the channel layer of intrinsic Si, intrinsic SiGe, or intrinsic Ge; and
   forming, in the substrate, a depleted layer of SiGe, Si:C, silicon germanium tin (SiGeSn), germanium tin (GeSn), gallium arsenide (GaAs), indium arsenide (InAs), or indium phosphorus (InP).

8. The method according to claim 1, comprising:
   forming the channel layer of an element or compound consisting of one or more elements from groups III, IV, and V; and
   forming, in the substrate, a depleted layer of a different material than the source, the drain, the substrate, or a combination thereof.

9. The method according to claim 1, comprising:
providing the ground plane layer to a thickness of between 10 nm and 100 nm;
forming the channel layer to a thickness of between 3 nm and 30 nm; and
forming, in the substrate, a depleted layer to a thickness of between 3 nm and 30 nm.

10. A method comprising:
forming a dummy gate, on a substrate, between a pair of spacers;
forming, in the substrate, a source and drain separated by a ground plane layer having a thickness of between 10 nanometers (nm) and 100 nm;
forming, on the substrate, a depleted layer of silicon germanium (SiGe), silicon carbon (Si:C), silicon germanium tin (SiGeSn), germanium tin (GeSn), gallium arsenide (GaAs), indium arsenide (InAs), or indium phosphorus (InP) to a thickness of between 3 nm and 30 nm, the depleted layer being formed of a different material than the source, the drain, the substrate, or a combination thereof;
removing the dummy gate from the substrate, forming a cavity between the pair of spacers;
epitaxially growing, after removal of the dummy gate, a channel layer on the ground plane layer, of intrinsic silicon (Si), intrinsic SiGe, or intrinsic germanium (Ge) to a thickness of between 3 nm and 30 nm;
forming a high-k layer on the channel layer and on side surfaces of the cavity; and
forming a replacement gate in the cavity.

11. The method according to claim 10, comprising:
etching a recess in the substrate above at least part of the ground plane layer by a reactive-ion etch (RIE) or a selective wet etch, after removal of the dummy gate; and
epitaxially growing the channel layer in the recess.

12. The method according to claim 10, comprising:
epitaxially growing a halo layer of Si, SiGe, or Ge to a thickness of between 5 nm and 20 nm in the recess prior to epitaxially growing the channel layer, the halo layer separating the channel layer from the ground plane layer, the source, and the drain.

* * * * *